(12) United States Patent
Stahr et al.

(10) Patent No.: US 9,960,022 B2
(45) Date of Patent: May 1, 2018

(54) SPUTTERING TARGET WITH OPTIMIZED PERFORMANCE CHARACTERISTICS

(71) Applicant: Materion Advanced Materials Germany GmbH, Hanau (DE)

(72) Inventors: Carl Christoph Stahr, Alzenau (DE); Martin Schlott, Offenbach (DE)

(73) Assignee: MATERION ADVANCED MATERIALS GERMANY GMBH, Hanau (DE)

( * ) Notice: Subject to any disclaimer, the term of this patent is extended or adjusted under 35 U.S.C. 154(b) by 131 days.

(21) Appl. No.: 14/441,861

(22) PCT Filed: Oct. 25, 2013

(86) PCT No.: PCT/EP2013/072384
§ 371 (c)(1),
(2) Date: May 11, 2015

(87) PCT Pub. No.: WO2014/075896
PCT Pub. Date: May 22, 2014

(65) Prior Publication Data
US 2015/0287577 A1  Oct. 8, 2015

(30) Foreign Application Priority Data
Nov. 14, 2012 (DE) .................. 10 2012 022 237

(51) Int. Cl.
| | | |
|---|---|---|
| C23C 14/00 | (2006.01) | |
| H01J 37/34 | (2006.01) | |
| C23C 14/08 | (2006.01) | |
| C23C 14/34 | (2006.01) | |

(52) U.S. Cl.
CPC ........ *H01J 37/3429* (2013.01); *C23C 14/083* (2013.01); *C23C 14/3414* (2013.01); *H01J 37/3426* (2013.01)

(58) Field of Classification Search
CPC .................................................. C23C 14/083
See application file for complete search history.

(56) References Cited

U.S. PATENT DOCUMENTS

| | | | | |
|---|---|---|---|---|
| 6,436,542 B1 * | 8/2002 | Ogino | ................. | B01J 35/002 428/426 |
| 2003/0038028 A1 | 2/2003 | Schultheis et al. | | |
| 2006/0048708 A1 * | 3/2006 | Hartig | ................. | C03C 17/002 118/715 |
| 2008/0124515 A1 * | 5/2008 | Ono | ................. | C04B 35/195 428/116 |
| 2009/0170685 A1 | 7/2009 | Hashiguchi et al. | | |
| 2012/0058883 A1 * | 3/2012 | Yamashita | ................. | C04B 35/49 501/134 |

FOREIGN PATENT DOCUMENTS

| | | |
|---|---|---|
| CN | 1208495 C | 6/2005 |
| CN | 1329747 C | 8/2007 |
| EP | 1211524 A2 | 6/2002 |
| EP | 1284302 A1 | 2/2003 |
| JP | H06-272033 A | 9/1994 |
| JP | 2001025666 A | 1/2001 |
| JP | 2003073820 A | 3/2003 |
| JP | 2009155171 A | 7/2009 |
| WO | 97008359 A1 | 3/1997 |
| WO | 9725450 A1 | 7/1997 |
| WO | 9725451 A | 7/1997 |
| WO | 2011110584 A1 | 9/2011 |

OTHER PUBLICATIONS

Search Report dated Aug. 11, 2016 in CN Application No. 201380059275.6.
Office Action dated Aug. 11, 2016 in CN Application No. 201380059275.6.
Office Action dated Jun. 1, 2016 in JP Application No. 2015-542198.
Int'l Search Report and Written Opinion dated Dec. 20, 2013 in Int'l Application No. PCT/EP2013/072384.
Chang et al, "Growth of highly oriented ZrTiO4 thin films by radio-frequency magnetron sputtering," Applied Physics Letters, vol. 64, No. 24, pp. 3252-3254 (Jun. 13, 1994).
Kim et al, "Effect of microstructures on the microwave dielectric properties of ZrTiO4 thin films," Applied Physics Letters, vol. 78, No. 16, pp. 2363-2365 (Apr. 16, 2001).
Reymond et al, "Relaxor properties of sputtered Ba(Ti,Zr)O3 thin films," Journal of Applied Physics D: Applied Physics, vol. 39, pp. 1204-1210 (2006).
Office Action dated Oct. 22, 2013 in DE Application No. 10 2012 022 237.8.
Victor et al, "Dielectric relaxation in laser ablated polycrystalline ZrTiO4 thin films," Journal of Applied Physics, vol. 94, pp. 5135-5142 (2003).

* cited by examiner

*Primary Examiner* — Timon Wanga
(74) *Attorney, Agent, or Firm* — Richard M. Klein; Fay Sharpe LLP

(57) ABSTRACT

The invention relates to a sputtering target containing a sputtering material containing a metal oxide. The sputtering material contains zirconium and titanium as metals and contains at least one mixed oxide phase.

9 Claims, No Drawings

SPUTTERING TARGET WITH OPTIMIZED PERFORMANCE CHARACTERISTICS

CROSS-REFERENCE TO RELATED APPLICATIONS

This application is a Section 371 of International Application No. PCT/EP2013/072384, filed Oct. 25, 2013, which was published in the German language on May 22, 2014 under International Publication No. WO 2014/075896 A1, and the disclosure of which is incorporated herein by reference.

BACKGROUND OF THE INVENTION

The invention relates to a sputtering target containing a metal oxide as a sputtering material, in which the sputtering material comprises zirconium and titanium as metal.

Such sputtering targets are well-known, for example, from WO 2011/110584 A1 and are used, for example, to produce coatings on glass. Sputtering targets made of a mixture of titanium dioxide and zirconium dioxide are used in this context. However, sputtering targets made of these compositions are associated with a disadvantage, in that they may contain major accumulations of non-conductive zirconium dioxide which tend to cause undesired formation of arcs (so-called arcing) during sputtering. This arcing adversely affects the sputtering process and the quality of the resulting coating.

Another solution is to use sputtering targets made of an alloy of titanium and zirconium. However, this necessitates so-called fully-reactive sputtering in order to produce the requisite oxide layers. This is a difficult process to implement, especially at high sputtering rates or high coating widths. It is therefore the object of the present invention to eliminate the known disadvantages of the prior art.

BRIEF SUMMARY OF THE INVENTION

According to the invention, a sputtering target comprises a sputtering material comprising a metal oxide. The sputtering material comprises zirconium and titanium and contains at least one mixed oxide phase, which prevents non-conductive and unwanted arcing-causing islands of material.

DETAILED DESCRIPTION OF THE INVENTION

A sputtering target according to the invention comprises a sputtering material comprising a metal oxide. The sputtering material comprises zirconium and titanium and contains at least one mixed oxide phase, which prevents non-conductive and unwanted arcing-causing islands of material.

It is advantageous, in particular, that the fraction of the mixed oxide phase in the sputtering target is at least 30 wt.-%, preferably at least 50 wt.-%, and in particular at least 70 wt.-%, based on the total weight of the sputtering material. Unlike oxide mixtures, no interfering non-conductive structures are present in mixed oxides of zirconium and titanium. Therefore, the higher the fraction of mixed oxide phase, the better is the sputtering behavior of the sputtering targets.

Preferably, the fraction of mixed oxide phase in the sputtering target is at least 95 wt.-%, based on the total weight of the sputtering material. It is also advantageous if the fraction of zirconium dioxide phases is at most 5 wt.-%, based on the total weight of the sputtering material. Such small amounts of zirconium dioxide phases are not associated with any detectable arcing.

It is also advantageous if the fraction or amount of zirconium in the metal fraction is 20 to 30 wt.-%. In this case, good coating results are obtained.

It is desirable, furthermore, that the sputtering material has an oxygen deficit relative to the stoichiometric composition, as this improves the conductivity of the material.

The sputtering material may be produced by joint melting of two metal oxides in a known manner. For example, the zirconium dioxide used as the starting material may be stabilized in a conventional manner (for example, with yttrium oxide or calcium oxide). The melting of the starting materials, titanium dioxide and zirconium dioxide, is preferably performed under reducing conditions such that the resulting sputtering material has an oxygen deficit (sub-stoichiometric oxygen content).

In addition to the zirconium and titanium, the sputtering material may contain other metal fractions which are inevitable at technical quality (for example, hafnium) or the stabilization materials specified above, which are often present at low concentration below approx. 10 wt.-%.

As an example, a mixture of 60 wt.-% titanium dioxide and 40 wt.-% zirconium dioxide may be jointly melted. Joint sintering is feasible as well. The resulting mixed oxide is ground and may then be applied to a support structure of the sputtering target by a spraying process, such as plasma spraying. The support structure may be a conventional support tube or a support plate, which is also common. The mixed oxide powder has a grain size of approx. 10 to 90 µm. The metallurgical melting or sintering processes used in the production are generally conventional and known to a person skilled in the art.

Exemplary Embodiment 1

A mixture of 60% $TiO_2$ and 40% $ZrO_2$ was melted jointly in an arc furnace. A sprayable powder was produced from the melted material after cooling by crushing, grinding, and classifying. The powder was sub-stoichiometric with a value of x=1.9 relative to the TiOx fraction. The powder was processed by plasma spraying onto a stainless steel tube to produce a target using an $Ar/H_2$ mixture. The target had a high homogeneity without $ZrO_2$ islands that would cause unwanted sparking (arcing) during the sputtering process.

Exemplary Embodiment 2

A mixture of 80 wt.-% $TiO_2$ and 20 wt.-% $Y_2O_3$ stabilized $ZrO_2$ was used to produce a powder by spray agglomeration from an aqueous suspension. The powder was sintered at 1,400° C. for 4 h and then classified into a sprayable particle size. Processing into a tube target took place by plasma spraying using an $Ar/H_2$ plasma as in Exemplary Embodiment 1.

The sputtering targets according to the invention produce very uniform layers with, at most, few structural defects that do not interfere by sparking.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A sputtering target comprising a sputtering material comprising a metal oxide, wherein the metal oxide comprises zirconium and titanium as a metal fraction, and contains at least 30 wt % of at least one mixed oxide phase, and wherein a fraction of zirconium in the metal fraction is 20 to 30 wt %.

2. The sputtering target according to claim 1, wherein the fraction of the mixed oxide phase in the sputtering material is at least 95 wt.-%, based on the total weight of the sputtering material.

3. The sputtering target according to claim 1, wherein the metal oxide comprises zirconium dioxide phases, and wherein a fraction of the zirconium dioxide phases is at most 5 wt.-%, based on the total weight of the sputtering material.

4. The sputtering target according to claim 1, wherein the sputtering material has an oxygen deficit relative to a stoichiometric composition.

5. The sputtering target of claim 1, wherein the sputtering material contains at least 50 wt % of the at least one mixed oxide phase.

6. The sputtering target of claim 1, wherein the sputtering material contains at least 70 wt % of the at least one mixed oxide phase.

7. The sputtering target of claim 1, wherein the metal fraction further comprises yttrium, calcium, or hafnium.

8. The sputtering target of claim 1, wherein the sputtering target comprises a stainless steel tube and a layer of the sputtering material thereon.

9. A sputtering target comprising:
a support structure; and
a sputtering material deposited on the support structure;
wherein the sputtering material comprises a metal oxide and at least 95 wt % of at least one mixed oxide phase;
wherein the metal oxide comprises zirconium and titanium, and a fraction of zirconium in the metal oxide is 20 to 30 wt %.

* * * * *